(12) United States Patent
Stanley et al.

(10) Patent No.: US 9,704,663 B2
(45) Date of Patent: Jul. 11, 2017

(54) ACCESSORY BUTTON CONTROLLER ASSEMBLY

(75) Inventors: Craig M. Stanley, Campbell, CA (US); Kurt R. Stiehl, San Jose, CA (US); Michael J. Webb, Scotts Valley, CA (US)

(73) Assignee: Apple Inc., Cupertino, CA (US)

( * ) Notice: Subject to any disclaimer, the term of this patent is extended or adjusted under 35 U.S.C. 154(b) by 942 days.

(21) Appl. No.: 13/476,945

(22) Filed: May 21, 2012

(65) Prior Publication Data

US 2013/0308787 A1  Nov. 21, 2013

(51) Int. Cl.
*H03G 3/00* (2006.01)
*H01H 9/02* (2006.01)
*H04R 1/10* (2006.01)

(52) U.S. Cl.
CPC ......... *H01H 9/0228* (2013.01); *H01H 9/0214* (2013.01); *H01H 2239/008* (2013.01); *H04R 1/1041* (2013.01); *H05K 2201/10053* (2013.01); *H05K 2203/1327* (2013.01)

(58) Field of Classification Search
CPC ............................. H04R 1/1075; H04R 5/033
USPC .... 381/74, 361, 375, 386, 94.1; 264/272.17, 264/272.15
See application file for complete search history.

(56) References Cited

U.S. PATENT DOCUMENTS

| | | | |
|---|---|---|---|
| 4,606,348 A * | 8/1986 | Panicci | 606/234 |
| 6,597,343 B1 * | 7/2003 | Akiyama et al. | 345/168 |
| 7,075,794 B2 * | 7/2006 | Gall et al. | 361/749 |
| 7,151,237 B2 | 12/2006 | Mahoney et al. | |
| 7,820,925 B2 | 10/2010 | Kuo et al. | |
| 8,073,178 B2 | 12/2011 | Tsao et al. | |
| 8,144,915 B2 | 3/2012 | Hankey et al. | |
| 8,155,337 B2 | 4/2012 | Choi et al. | |
| 8,170,231 B2 | 5/2012 | Garra et al. | |
| 8,204,268 B2 | 6/2012 | Li | |

(Continued)

FOREIGN PATENT DOCUMENTS

| CN | 2891254 | 4/2007 |
|---|---|---|
| CN | 201282545 | 7/2009 |

(Continued)

OTHER PUBLICATIONS

International Search Report, PCT/US2013/041913, 7 pages, Jan. 7, 2014.

*Primary Examiner* — Alexander Jamal
(74) *Attorney, Agent, or Firm* — McDermott Will & Emery LLP

(57) ABSTRACT

An accessory may be provided with a button controller having a microphone and switches. Plastic structures for the accessory may be formed by injection molding. Plastic structures may be molded around a printed circuit and wiring. The wiring may have a plastic jacket. The molded plastic structures may bond with the plastic jacket to retain the wiring. The molded plastic structures may be molded directly to the printed circuit board. Protrusions on the molded plastic structures may mate with openings in a metal clip. Housing structures may be mounted to the metal clip. The metal clip may be provided with a spring to short the metal clip to a trace on the printed circuit. The metal clip may also have a portion that receives electrostatic charge during electrostatic discharge events and that discharges the charge through the spring to the trace on the printed circuit.

20 Claims, 15 Drawing Sheets

(56) References Cited

U.S. PATENT DOCUMENTS

| | | | |
|---|---|---|---|
| 8,995,677 B2* | 3/2015 | Lin et al. | 381/74 |
| 2002/0044514 A1* | 4/2002 | Aizawa et al. | 369/75.1 |
| 2006/0098836 A1* | 5/2006 | Sabick | H04R 1/1016 381/380 |
| 2007/0264850 A1* | 11/2007 | Bruckhoff | 439/83 |
| 2009/0042623 A1* | 2/2009 | Shiono et al. | 455/575.1 |
| 2010/0104126 A1* | 4/2010 | Greene | 381/384 |
| 2010/0150370 A1* | 6/2010 | Bales et al. | 381/74 |
| 2010/0208920 A1* | 8/2010 | Lee et al. | 381/122 |
| 2011/0007485 A1* | 1/2011 | Hirai | 361/753 |
| 2011/0096456 A1* | 4/2011 | Kim | 361/220 |
| 2012/0099742 A1 | 4/2012 | Edeler | |

FOREIGN PATENT DOCUMENTS

| | | |
|---|---|---|
| CN | 201491423 | 5/2010 |
| TW | I334195 | 12/2010 |

* cited by examiner

ACCESSORY BUTTON CONTROLLER ASSEMBLY

BACKGROUND

This relates to electronic devices, and more particularly, to accessories for electronic devices.

Electronic devices such as computers, media players, and cellular telephones typically contain user interface components that allow these devices to be controlled by a user. It is sometimes desirable to add accessories to electronic devices. For example, a user may desire to plug a headset or adapter accessory into an electronic device to allow the user to listen to audio.

Headsets are sometimes provided with buttons and microphones. A headset microphone may be used to pick up a user's voice during a telephone call. Buttons may be used to control media file playback, to make volume level adjustments during a telephone call, and to issue other commands for the electronic device. Buttons and a microphone may be mounted within a button controller assembly. Microphone signals and button signals may be routed from the button controller assembly to an electronic device using wires in the headset.

The designers of accessories and other electronic equipment are challenged with designing parts that are not overly complex or costly and that exhibit satisfactory reliability and performance It would therefore be desirable to provide improved electronic device accessories such as accessories with button controller assemblies.

SUMMARY

An accessory may be provided with ear buds, a cable, and a button controller coupled to the cable.

The ear buds may have a hollow neck portion. A wire in the ear buds may be knotted to prevent removal of the wire from the hollow neck portion. To prevent the knot from over-tightening, a bead may be placed over the wire in the knot.

The button controller may have a printed circuit that contains conductive traces, a microphone, switches, and other circuitry. Plastic structures for the button controller may be formed by injection molding within an injection molding tool. The injection molding tool may have shutoff structures. Each shutoff structure may have a protrusion that forms a recess. The recess may accommodate traces on the printed circuit board by allowing the shutoff structure to hold the printed circuit board during injection molding operations without crushing traces that are overlapped by the recess.

Plastic structures may be molded around a printed circuit and wiring. The wiring may have a plastic jacket. The molded plastic structures may bond with the plastic jacket to retain the wiring. The molded plastic structures may be molded directly to the printed circuit board. Protrusions on the molded plastic structures may mate with openings in a metal clip. Housing structures may be mounted to the metal clip.

The metal clip may be provided with a spring that shorts the metal clip to a trace on the printed circuit. The metal clip may also have a portion such as a protrusion that receives electrostatic charge during electrostatic discharge events and that discharges the charge through the spring to the trace on the printed circuit.

The microphone hole on the printed circuit may be covered with a conductive mesh that is attached to the printed circuit with conductive adhesive to provide additional electrostatic discharge protection.

Further features of the invention, its nature and various advantages will be more apparent from the accompanying drawings and the following detailed description of the preferred embodiments.

DETAILED DESCRIPTION

Electronic components such as microphones and buttons may be used in a wide range of applications. For example, microphones and buttons may be used to form a button controller for a headset or other accessory. Button structures and microphone structures may, in general, be used in any suitable system. Button controller assemblies that are suitable for use in accessories such as electronic device headsets are sometimes described herein as an example.

Figure 1:
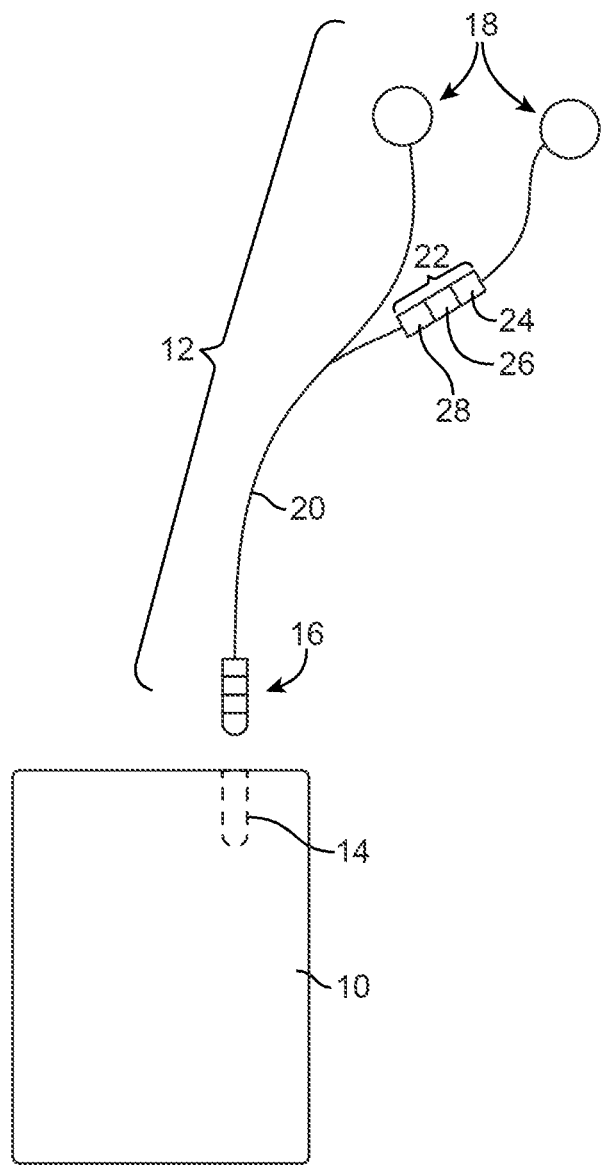
FIG. 1 is a diagram of a system including an electronic device and associated accessory in accordance with an embodiment of the present invention.

An illustrative system in which an accessory may be used with an electronic device is shown in FIG. 1. As shown in FIG. 1, electronic device 10 may be coupled to an accessory such as headset 12 by plugging plug 16 of accessory 12 into jack 14 of electronic device 10.

Electronic device 10 may be a computer such as a desktop computer, tablet computer, or laptop computer. Device 10 may also be a handheld electronic device such as a cellular telephone or media player, a tablet device, other portable electronic devices, or any other electronic equipment. Headset 12 may have speakers 18 and controller 22. Controller 22 may have buttons and may therefore sometimes be referred to as a button controller or button controller assembly. Button controller 22 and speakers 18 may be coupled to device 10 using cable 20. Cable 20 may contain multiple wires. Button controller 22 may, if desired, include a microphone. The microphone may be used by a user of device 10 and headset 12 during a telephone call (e.g., to pick up the user's voice).

Button controller 22 may include buttons such as buttons 24, 26, and 28. There may, in general, be any suitable number of buttons in button controller 22 (e.g., one or more buttons, two or more buttons, three or more buttons, etc.). With one suitable arrangement, which is sometimes described herein as an example, button controller 22 may include three buttons. These buttons may be used to issue commands for device 10. Examples of commands that may be issued for device 10 using the buttons of button controller assembly 22 include stop, forward, and reverse commands, volume up and down commands, telephone call control commands, etc.

Figure 2:
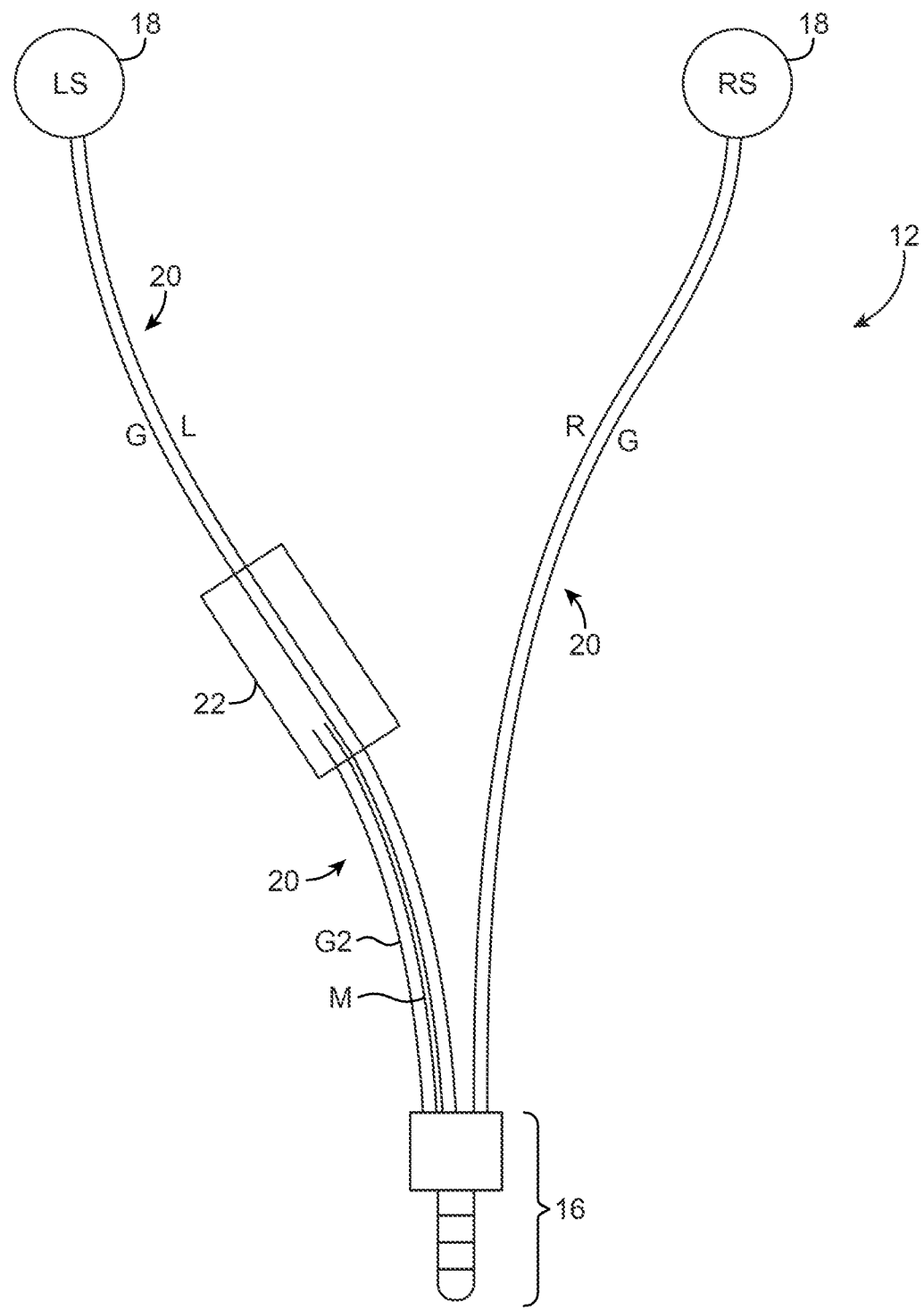
FIG. 2 is a wiring diagram for an illustrative accessory such as a pair of headphones with a button controller that has switches and a microphone in accordance with an embodiment of the present invention.

A wiring diagram of an illustrative accessory such as headset 12 of FIG. 1 is shown in FIG. 2. As shown in FIG. 2, headset 12 may have wires in cables 20 that interconnect left speaker 18 (LS), right speaker 18 (RS), plug 16, and button controller 22. Two ground lines (G and G2) may be coupled to a ground terminal in plug 16. A microphone line (M), left speaker line (L), and right speaker line (R) may be coupled to a microphone terminal, left speaker terminal, and right speaker terminal in plug 16, respectively. Ground line G2 and microphone line M may terminate on terminals in button controller 22. Ground line G and speaker line L may pass through the housing of button controller 22 to couple to speaker terminals in left speaker LS. Right speaker RS may have terminals that are coupled between right speaker line R and ground speaker line G.

Figure 3:
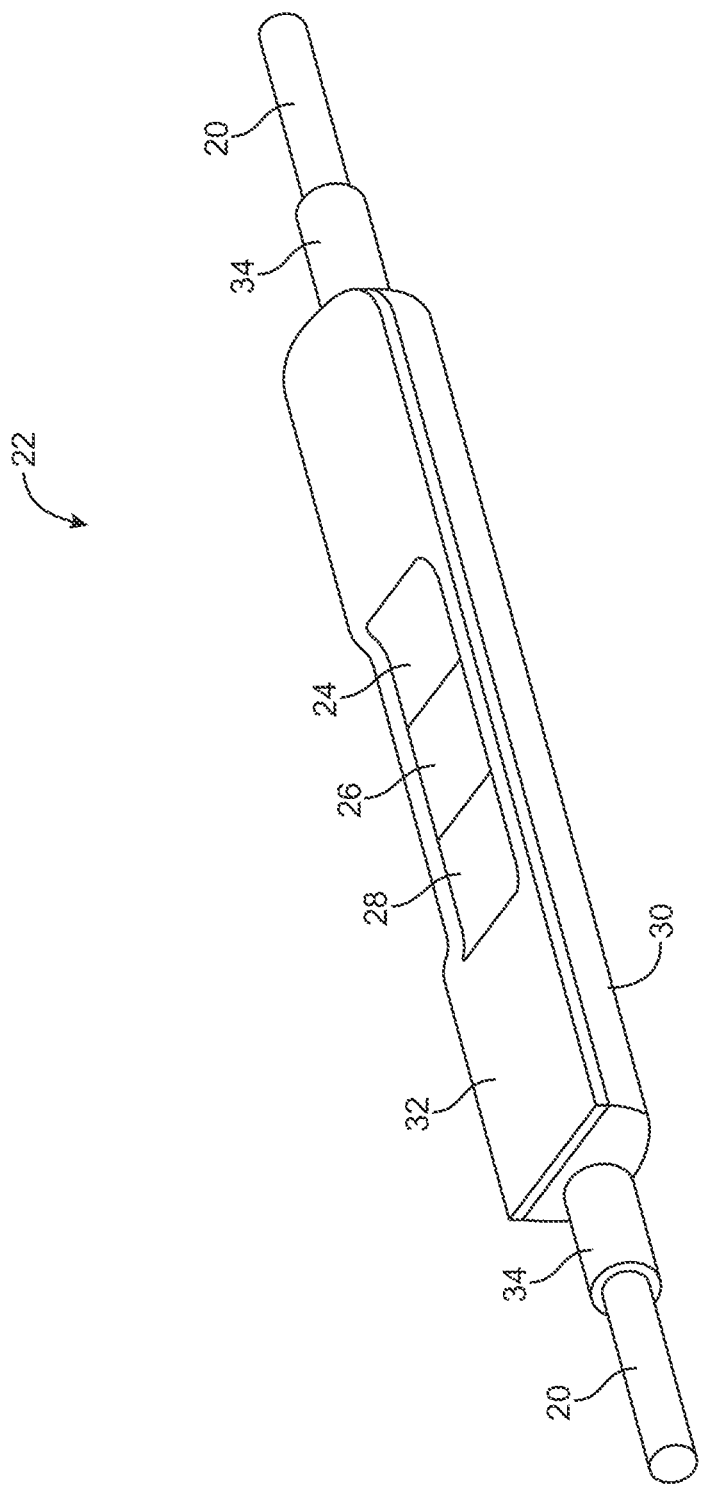
FIG. 3 is perspective view of an illustrative button controller in accordance with an embodiment of the present invention.

FIG. 3 is a perspective view of an illustrative button controller for an accessory. As shown in FIG. 3, button controller 22 may have a housing formed from lower housing member 30 and upper housing member 32. Button labels for buttons such as buttons 28, 26, and 24 may be formed from portions of member 32 that overlap corresponding switches in the interior of button controller 22. During operation, upper housing member 32 and/or lower housing member 30 may flex where squeezed by a user. When flexed in this way, the flexing housing member structures in button controller 22 may press inwardly against a corresponding switch on a printed circuit board in the interior of button controller 22. As an example, a printed circuit in controller 22 may be provided with an array of three switches. When a user squeezes button controller 22 between the user's finger to actuate a particular one of buttons 24, 26, and 28, a portion of member 30 that overlaps a corresponding switch may flex and actuate that switch. Other types of switch actuation schemes may be used in button controller 22, if desired. The use of flexing housing members to operate corresponding internal switches is merely illustrative.

Strain relief structures such as strain relief structures 34 may help guide cables 20 into and out of button controller assembly 22.

Figure 4:
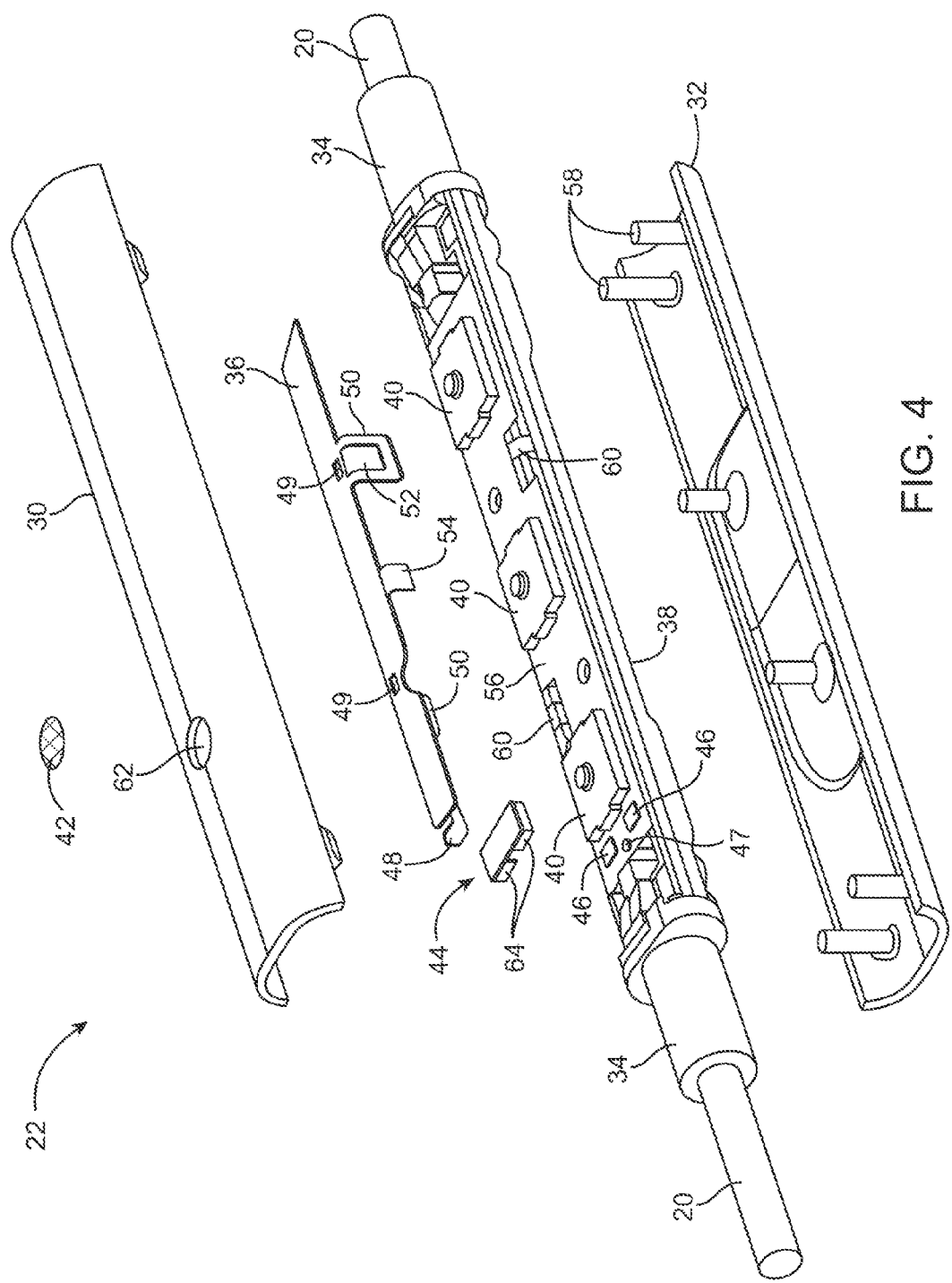
FIG. 4 is an exploded perspective view of the button controller of FIG. 3 in accordance with an embodiment of the present invention.

FIG. 4 is an exploded rear perspective view of button controller 22. As shown in FIG. 4, controller 22 may include rear housing member 30 (e.g., a flexible plastic structure). Rear housing member 30 may have an opening such as opening 62 that may or may not permit sound to pass from the exterior of button controller 22 to a microphone in the interior of button controller 22. Opening 62 may be covered with a mesh such as a metal mesh 42 or other structure that allows sound to pass.

In the interior of button controller 22, printed circuit board microphone hole 47 in may be covered with a mesh such as mesh 44 or other material that may or may not allow sound to pass. Mesh 44 may be formed form a conductive material such as metal or metal-coated plastic and may be attached to traces such as ground traces 46 on printed circuit board 56 and/or other conductive structures such as using conductive adhesive 64. The use of conductive adhesive 64 to attach mesh 44 to ground traces on printed circuit board 56 may help to discharge static charge, thereby helping to provide button controller 22 with immunity to electrostatic discharge (ESD) events.

Plastic structures 38 may be overmolded over printed circuit 56. As shown in FIG. 4, plastic structures 38 have engagement features such as snaps 60 that are configured to mate with corresponding engagement features in clip member 36. Clip member 36 may, for example, be formed from a sheet of patterned metal having prongs 50 with holes 52 that are configured to mate with snaps 60. Clip member 36 may be attached to housing member 30 using adhesive, heat stakes, or other attachment mechanisms. Because structures 38 may be overmolded directly to printed circuit 56 and because snaps 60 may be formed as integral parts of structures 38, mechanical tolerances associated with attaching clip 36 and housing member 30 relative to printed circuit 56 may be well controlled. Switches 40 may be accurately located relative to printed circuit 56 by soldering switches 40 to printed circuit 56, so the arrangement of FIG. 4 may be used to accurately locate housing member 30 relative to switches 40 to enhance performance.

Printed circuit board 56 may be supported using over-molded plastic structures 38. Components may be mounted on printed circuit board 56 such as a microphone, discrete electrical components, integrated circuits for audio and communications functions, and other circuitry. Switches 40 may be soldered to printed circuit board 56 in alignment with printed labels for buttons in button regions 28, 26, and 24 on upper housing member 32. Traces on printed circuit board 56 and other circuitry may be used to interconnect switches 40 with wires in cable 20. Housing structures such as housings 30 and 32 may be formed from materials such as plastic. Heat stakes such as heat stakes 58 on housing member 32 may be used to attach housing member 32 to plastic structure 38. Heat stakes on housing member 30 may engage with heat stake openings 49 on clip 36.

When a user actuates a desired button by squeezing members 30 and 32 inwardly towards each other, a corresponding portion of housing member 30 may deflect and press against a respective one of switches 40. If desired, button member 32 may be configured to deflect to compress switches such as switches 40 (e.g., in addition to or as an alternative to a configuration in which housing member 30 deflects). The configuration of FIG. 4 in which deflection of flexible housing member 30 is used to actuate switches 40 is merely illustrative. Switch 40 may be tact switches (e.g., switches based on dome switch members mounted in individual plastic switch housings) or may be switches of other suitable types.

Ground traces such as grounding pad structures 46 may be formed on printed circuit 56. Metal clip 36 may have features such as protruding tab structure 54 that serve to gather electrostatic charge from a user's fingers during an electrostatic discharge event. To provide a grounding path that helps discharge the electrostatic charge, clip 36 may have a portion such as spring portion 48 that is configured to contact grounding pad structures 46 or other conductive traces on printed circuit 56.

Plastic structures 38 may be formed by injection molding plastic into a mold structure on printed circuit 56. This type of injection molding process may sometimes be referred to as overmolding and plastic structures 38 may sometimes be referred to as overmold structures or an overmold. As shown in FIG. 4, strain relief structures such as strain relief structures 34 may be overmolded on structures 38. Strain relief structures 34 may, as an example, be formed from a soft elastomeric plastic material that is configured to flex as cable 20 flexes. Strain relief structures 34 may enclose and surround cable 20 and the wires within cable 20.

Figure 5:
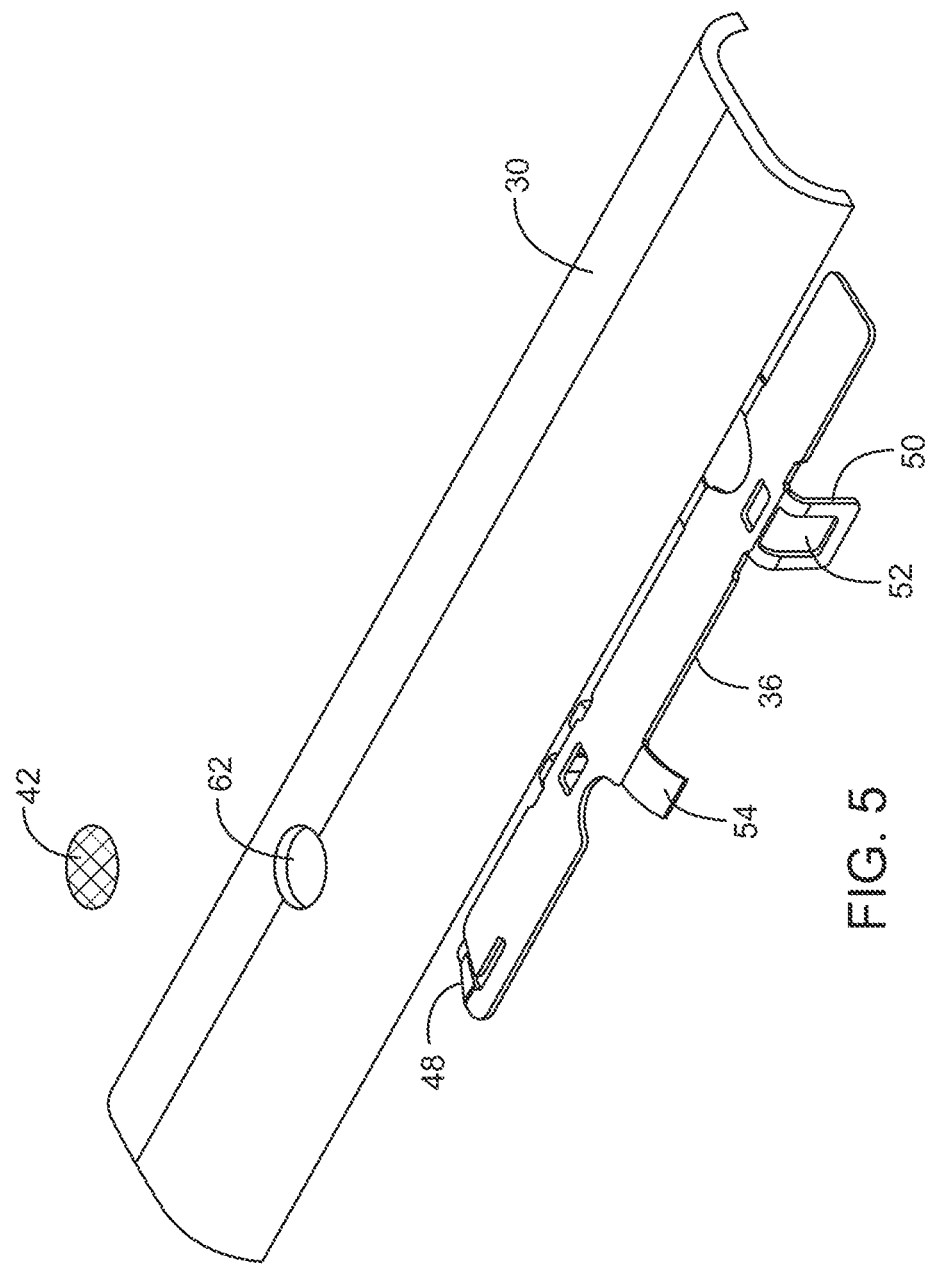
FIG. 5 is an exploded perspective view of button controller assembly components such as a button cover member and clip structure in accordance with an embodiment of the present invention.

FIG. 5 is an exploded perspective view of lower housing member 30, microphone mesh 42, and clip 36.

Figure 6:
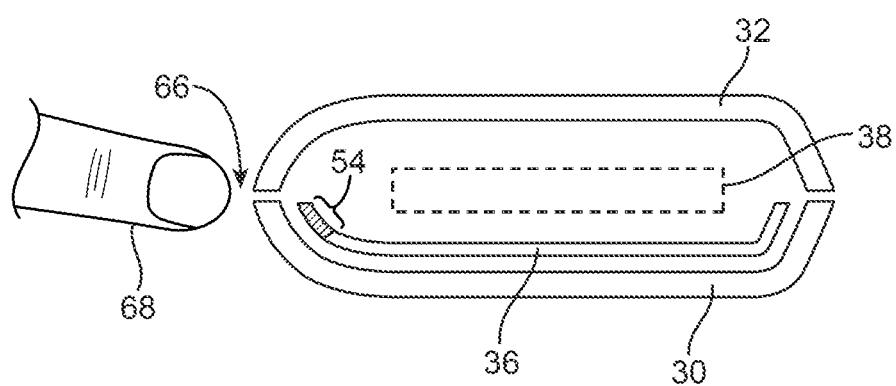
FIG. 6 is a cross-sectional end view of an illustrative button controller in accordance with an embodiment of the present invention.

FIG. 6 is a cross-sectional end view of button controller 22 of FIG. 3 taken in the vicinity of protruding tab 54. As shown in FIG. 6, the presence of protruding tab 54 or other suitable portions of clip 36 that are located in the vicinity of gap 66 between upper housing 32 and lower housing 30 may help to gather static charge from external objects such as finger 68. Clip 36 may be shorted to ground using ground traces 46, thereby discharging charge buildup during an electrostatic discharge event.

Injection molded plastic structure 38 (FIG. 4) may be injection molded over electronic components and conductive traces on a printed circuit board such as printed circuit 56. Printed circuit 56 may be a rigid printed circuit board such as a fiberglass-filled epoxy printed circuit board (e.g., an FR4 board), may be a flexible printed circuit ("flex circuit") such as a flexible sheet of polyimide or other flexible polymer layer, may be an injection molded plastic substrate or other dielectric support structure, or may be formed from two or more of these structures.

Figure 7:
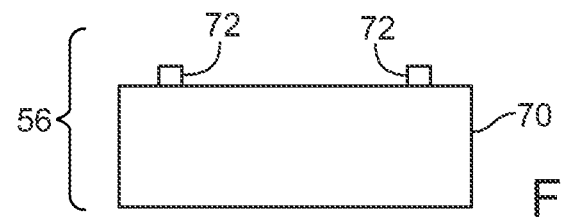
FIG. 7 is a cross-sectional end view of a substrate with traces in accordance with an embodiment of the present invention.

Initially, as shown in FIG. 7, a printed circuit substrate such as substrate 70 may be covered with patterned metal traces 72 to form printed circuit structures 56. Substrate 70 may be, for example, a rigid printed circuit board substrate or a flex circuit substrate. Traces 72 may be formed using screen printing, pad printing, ink-jet printing, physical vapor deposition, chemical vapor deposition, photolithography, or other suitable fabrication techniques. Traces 72 may be formed from metals such as aluminum, copper, gold, etc.

Figure 8:
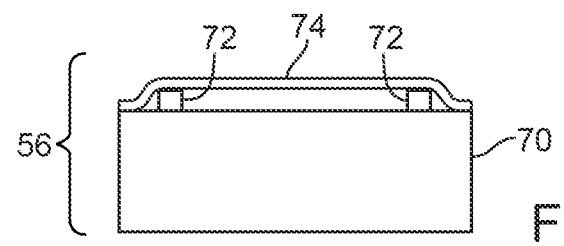
FIG. 8 is a cross-sectional end view of the substrate of FIG. 7 following application of a flexible layer of polymer in accordance with an embodiment of the present invention.

As shown in FIG. 8, traces 72 in printed circuit 56 may be covered with a thin protective polymer layer such as polymer layer 74. During subsequent injection molding operations, printed circuit 56 of FIG. 8 may be held in place by support structures within an injection molding tool cavity. Some of the injection molding support structures may be used to block the flow of injection molded plastic into particular portions of printed circuit 56 and may therefore sometimes be referred to as shutoff structures.

Figure 9:
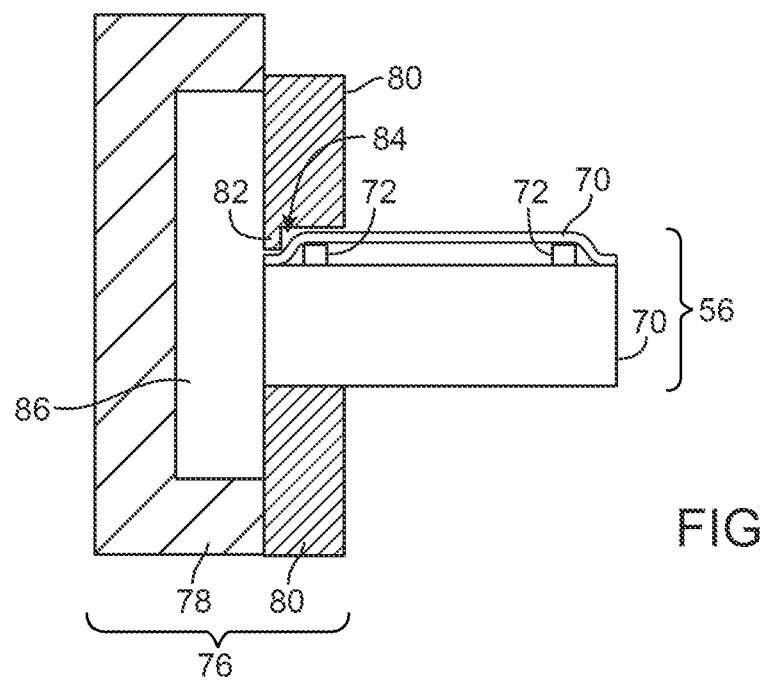
FIG. 9 is a cross-sectional end view of the substrate and polymer layer of FIG. 8 after installation in an injection molding tool in accordance with an embodiment of the present invention.

A portion of an illustrative injection molding tool in which printed circuit structures 56 of FIG. 8 have been mounted is shown in FIG. 9. Injection molding tool 76 may include mold structures such as mold structures 78 and may include mold structures such as shutoff structures 80. As shown in FIG. 9, some shutoff structures 80 may have a protruding portion such as protrusion 82. Protrusion 82 may create a recess such as recess 84. When mounted on printed circuit 56 as shown in FIG. 9, protrusion 82 may be used to bear against the upper surface of printed circuit 56 while recess 84 accommodates traces 72 by overlapping traces 72 without exerting excessive pressure on traces 72. By using shutoff structures such as shutoff structure 80 of FIG. 9 that have a protrusion such as protrusion 82 and a corresponding recess such as recess 84, injection molding support structures such as structures 78 and 80 may hold printed circuit 56 firmly without crushing surface features such as metal traces 72. While printed circuit 56 is held securely in place in this way, plastic may be injected into mold cavities such as cavity 86 without causing polymer layer 74 to peel off of substrate 70 due to injected plastic between substrate 70 and layer 74.

Figure 10:
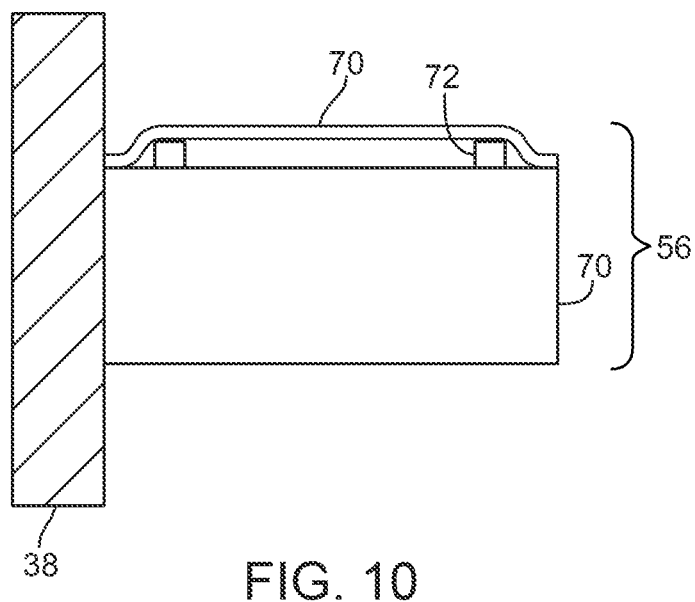
FIG. 10 is a cross-sectional end view of the substrate of FIG. 8 following injection molding of a plastic structure using the injection molding tool of FIG. 9 in accordance with an embodiment of the present invention.
Figure 11:
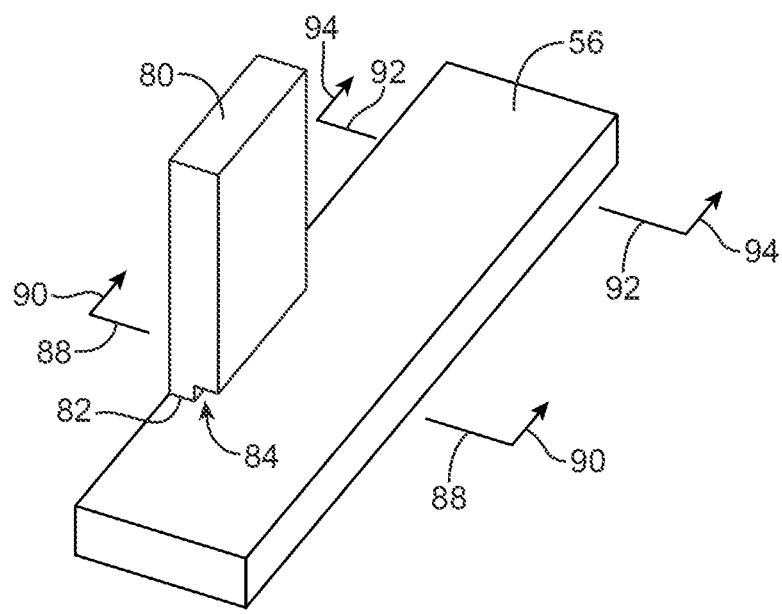
FIG. 11 is a perspective view of a substrate with an injection molding tool shut-off structure in accordance with an embodiment of the present invention.

A cross-sectional end view of printed circuit structures 56 following formation of a plastic structure such as structure 38 following injection molding of plastic into cavity 86 of FIG. 9 while using shutoff structure 80 and mold structures 78 is shown in FIG. 10. FIG. 11 is a perspective view of printed circuit 56 showing how shutoff structures such as shutoff structure 80 of FIG. 9 may be located a particular points along the length of an elongated printed circuit such as printed circuit 56. Only one shutoff structure 80 is shown in the example of FIG. 11, but in general, two or more, three or more, five or more, or ten or more shutoff structures may be used in holding printed circuit 56 during molding operations.

Figure 12:
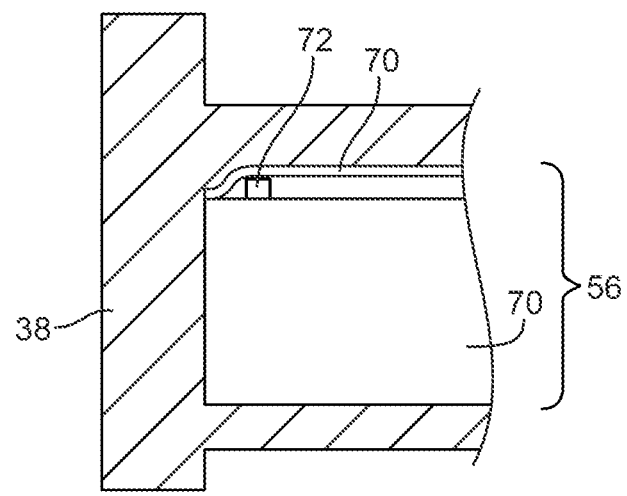
FIG. 12 is a cross-sectional end view of the substrate of FIG. 8 following injection molding of a plastic structure in accordance with an embodiment of the present invention.

The cross-sectional end view of FIG. 10 was taken along line 88 of FIG. 11 and viewed in direction 90 of FIG. 11 (following removal of shutoff structure 80 from printed circuit 56). In regions of printed circuit 56 without shutoff structures, injected plastic may cover more of printed circuit 56. As an example, plastic structures such as plastic structures 38 of FIG. 12 may be formed by injection molding plastic into molding tool 78 in portions of printed circuit without a shutoff structure. The cross-sectional end view of FIG. 12 has been taken along line 92 of FIG. 11 and viewed in direction 92 and shows how printed circuit 56 of FIG. 11 may appear following molding operations.

Figure 13:
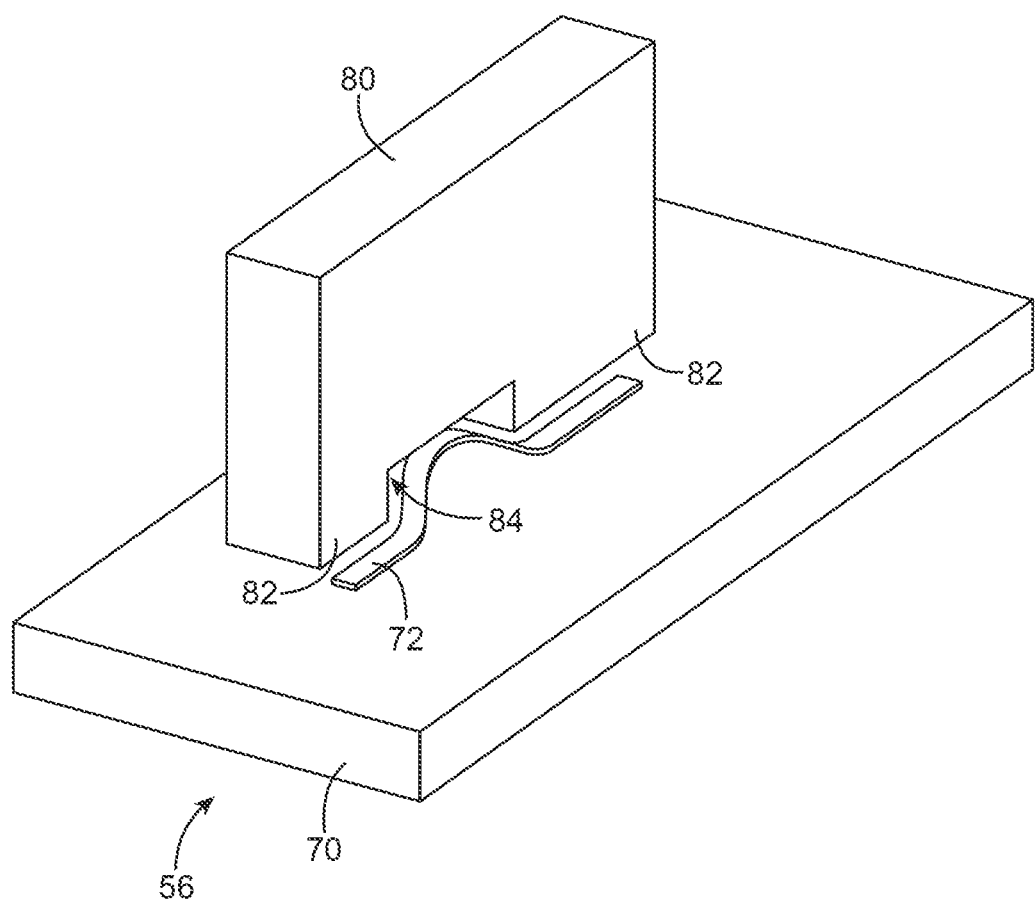
FIG. 13 is a perspective view of a shut-off structure in an injection molding tool that has a recess that is configured to bridge overlapped traces on a substrate during molding operations in accordance with an embodiment of the present invention.

If desired, shutoff structures may be provided with multiple protrusions. As an example, illustrative shutoff structure 80 of FIG. 13 has been configured to have two protrusions 82, so that recess 84 forms a notch that bridges traces 72.

Figure 14:
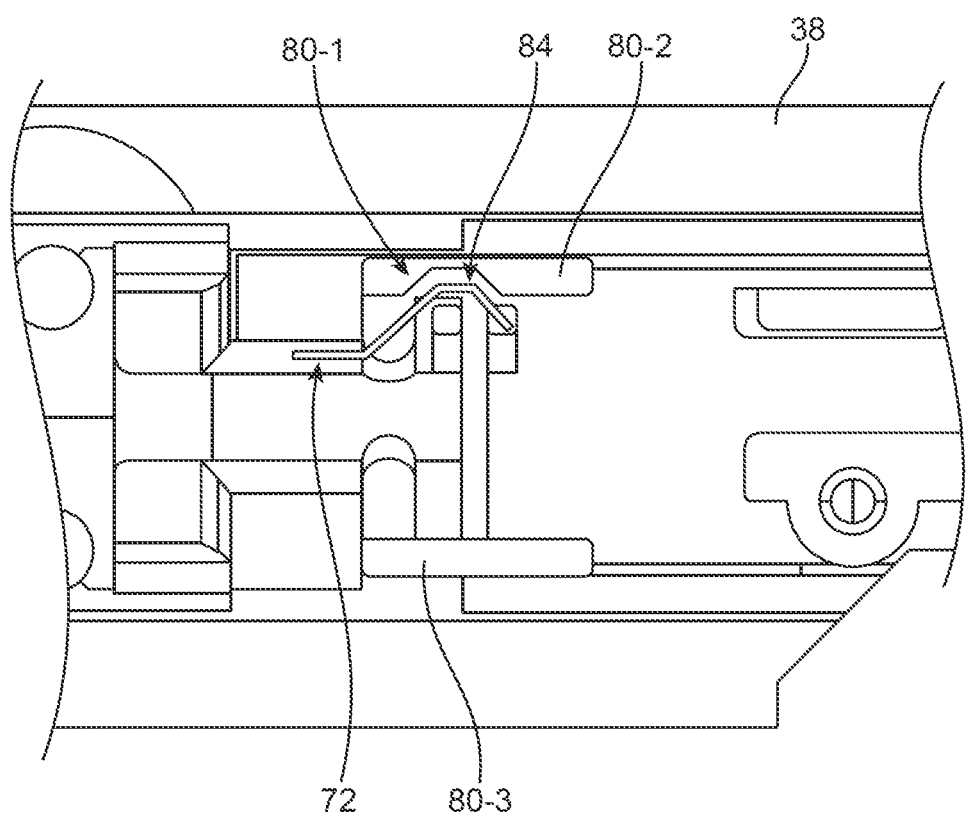
FIG. 14 is top view of a portion of a button controller structure showing shut-off regions that may be contacted by shut-off structures in an injection molding tool during injection molding operations in accordance with an embodiment of the present invention.

A top view of plastic structures 38 showing regions where shutoff structures 80 may contact printed circuit 56 during injection molding operations is shown in FIG. 14. As shown in FIG. 14, a shutoff structure placed along the upper edge of printed circuit 56 may contact printed circuit 56 at locations such as locations 80-1 and 80-2, whereas a shutoff structure placed along an opposing lower edge of printed circuit 56 may contact printed circuit 56 at location 80-3. The upper shutoff structure (in this example) may have protrusions that form a recess such as recess 84 that bridges printed circuit traces such as trace 72, thereby preventing traces 72 from being crushed during molding operations.

Figure 15:
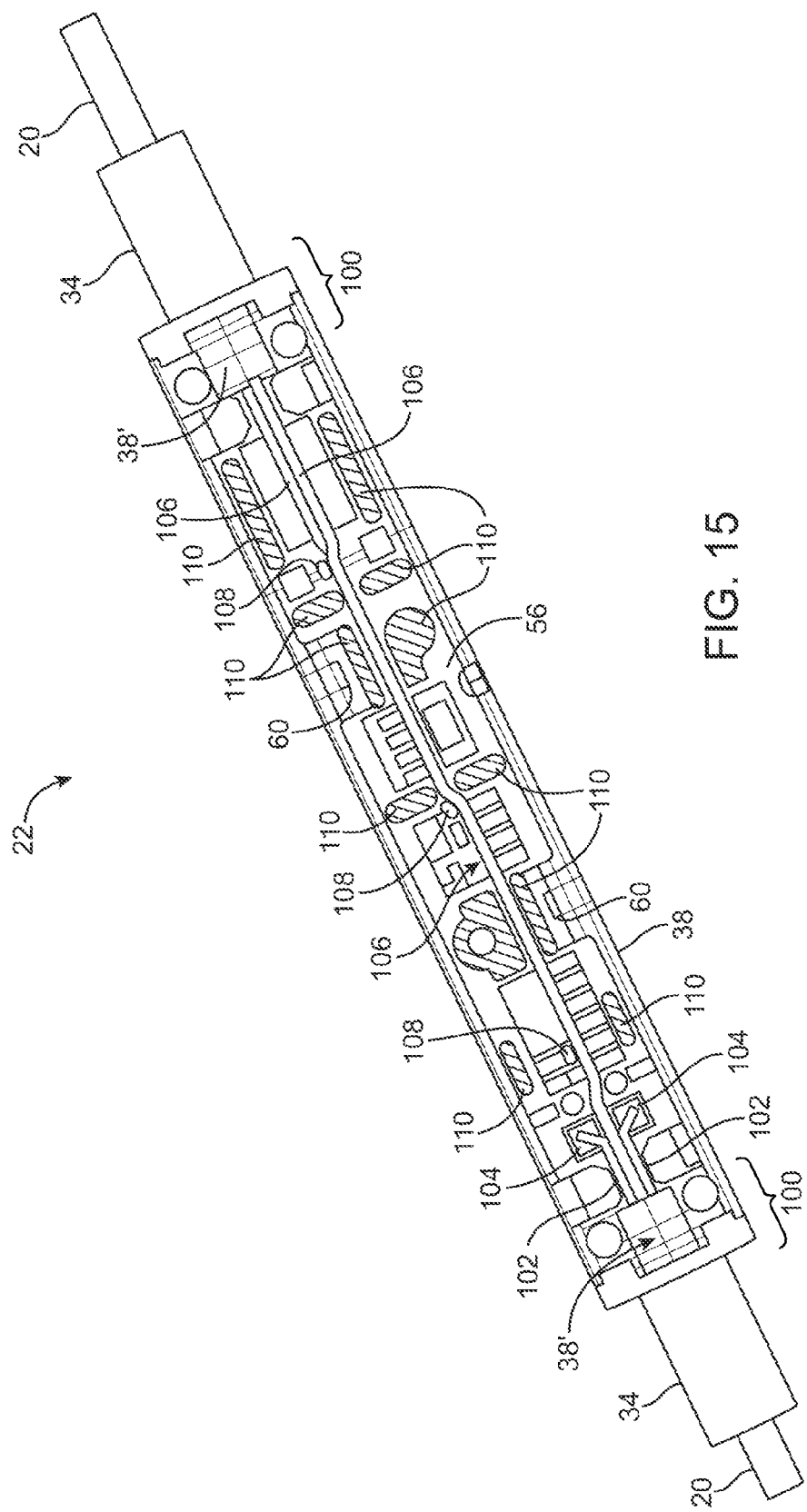
FIG. 15 is a perspective view of a portion of a button controller showing how a cable may be routed through an overmolded structure to help retain the cable within the button controller in accordance with an embodiment of the present invention.

FIG. 15 is a rear perspective view of internal structures that may be formed in illustrative button controller 22. As shown in FIG. 15, plastic structures 38 may be molded to form portions 38' that surround cable 20. Cable 20 may contain wiring surrounded by a plastic jacket. Following injection molding of injection molded plastic material 38, portions 38' of plastic structures 38 may form a bond with the plastic coating (jacket) material on cable 20. The bond between injection molded plastic support structures 38 and the plastic jacket of cable 20 may form a retention mechanism for holding cable 20 in place within button controller 22.

Recesses, protrusions, and other interlocking shapes may be formed in end regions 100 of structures 38. Strain relief structures 34 may then be overmolded on top of structures 38. Once overmolded, strain relief structures 34 may engage with the interlocking shapes of structures 38 and may surround cable 20, thereby helping to retain cable 20 to button controller 22.

Wires 102 of cable 20 such as wires M and G2 of FIG. 2 may be soldered to pads 104 on printed circuit 56. Wires 106 such as wires L and G of FIG. 2 may be routed along the length of printed circuit 56. Adhesive such as glue 108 may help hold wires 106 in place along printed circuit 56. Illustrative locations where molding tool structures (shutoff structures) may contact printed circuit board 56 during molding are shown by areas 110 in FIG. 15.

Figure 16:
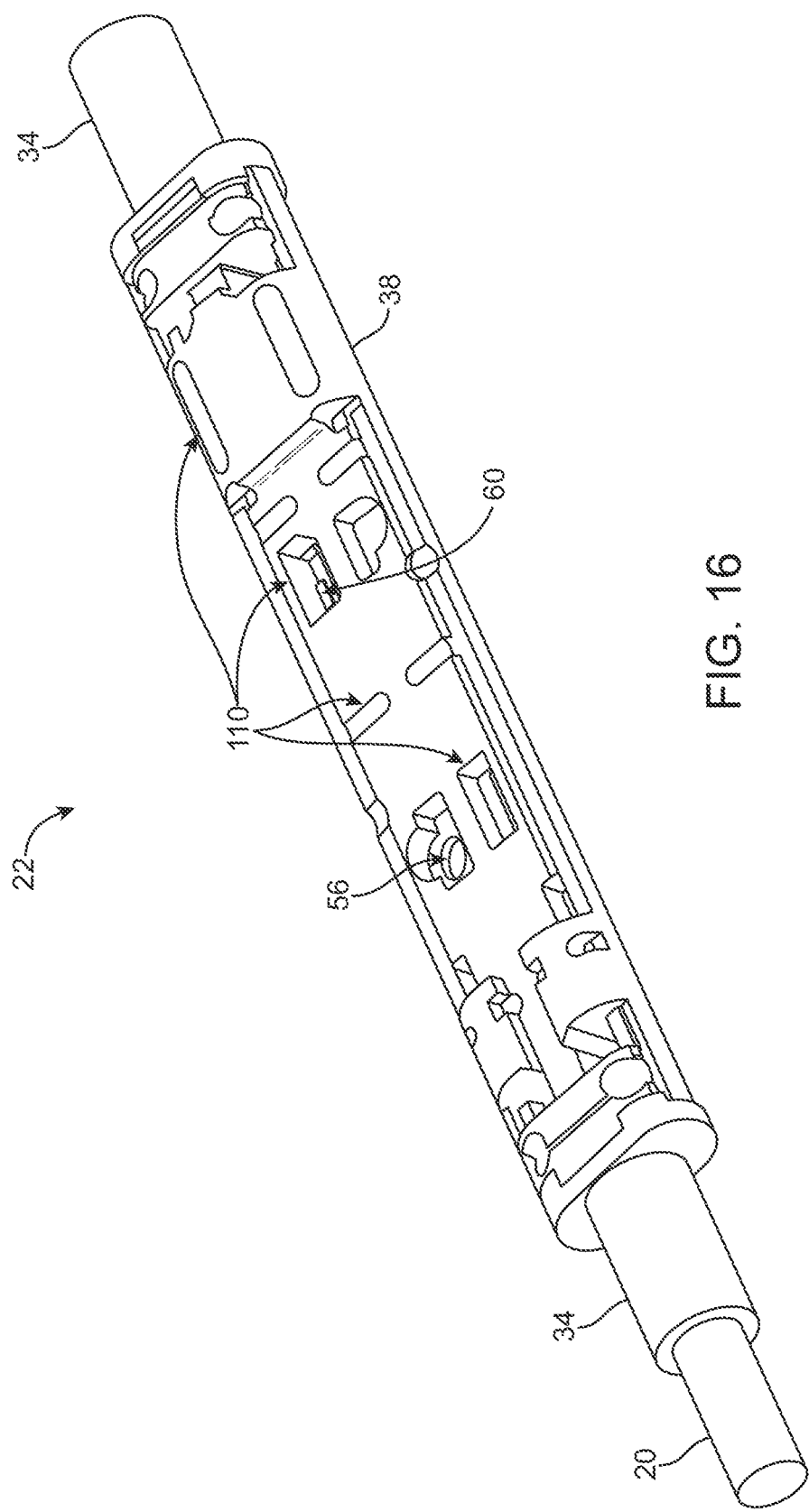
FIG. 16 is a perspective view of a portion of a button controller showing how engagement features such as snaps may be molded into an overmold structure in accordance with an embodiment of the present invention.

FIG. 16 is a front perspective view of internal structures that may be formed in illustrative button controller 22. As shown in FIG. 16, structures 38 may have openings 110 corresponding to the locations of shutoff structures 80 during injection molding operations. Snaps 60 may be used to engage openings 52 in clip tabs 50 (FIG. 4). Snaps 60 may be formed as integral portions of structures 38. By overmolding structures 38 over printed circuit 56, tight tolerances on the position of snaps 60 relative to switches 40 (soldered to printed circuit 56) may be achieved.

Figure 17:
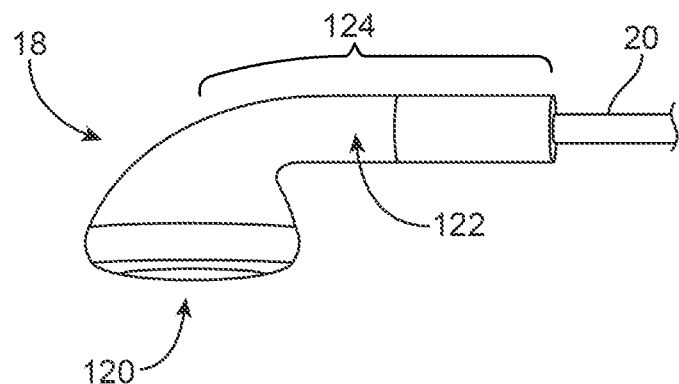
FIG. 17 is a perspective view of an earbud in accordance with an embodiment of the present invention.
Figure 18:
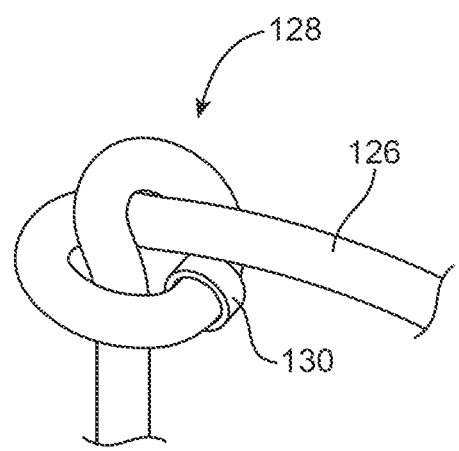
FIG. 18 is a perspective view of a bead structure that may be used in a cable knot to help retain a cable in an earbud of the type shown in FIG. 17 in accordance with an embodiment of the present invention.

FIG. 17 is a diagram of an illustrative earbud. As shown in FIG. 17, earbud 18 may have a portion such as speaker enclosure structure 120 that contains a speaker driver for emitting sound when earbud 18 is located in a user's ear. Earbud 18 may also have a neck portion such as neck structure 124 that couples speaker enclosure structure 120 to cable 20. Neck structure 124 may be hollow to accommodate wires in cable 20. To prevent cable dislodgement during use of accessory 12, the wires of cable 20 such as wires 126 of FIG. 18 (e.g., a positive signal line and a ground signal line encased in a common jacket) may be provided with a knot such as knot 128. Knot 128 may be placed in region 122 of neck structure 124 (FIG. 17) to prevent cable 20 from being pulled out of earbud 18 during use.

To prevent knot 128 from becoming compressed during use of accessory 12, a knot retention structure such as bead 130 may be threaded onto wires 126 prior to knot formation. Bead 130 may have the shape of a ring with a circular opening. Wires 126 may be routed through the circular opening before tying wires 126 to form knot 128. In the absence of ring 130, tension on wires 126 during use has the potential to compress knot 128, leading to a possibility that knot 128 will become too small to be securely retained within the hollow core of neck structure 124. In the presence of ring 130, knot 128 is tied to ring 130 and will remain sufficiently large to prevent cable 20 and wire 126 from being pulled through neck structure 124.

The foregoing is merely illustrative of the principles of this invention and various modifications can be made by those skilled in the art without departing from the scope and spirit of the invention.

What is claimed is:

1. An accessory button controller, comprising:
   wiring having a plastic jacket;
   a printed circuit board comprising at least one switch coupled to the wiring;
   a plastic structure overmolded over the printed circuit board;
   a strain relief structure overmolded over:
      an end region of the plastic structure; and
      a portion of the plastic jacket; and
   a first outer housing member forming a first portion of an external surface of the accessory button controller; and
   a second outer housing member forming a second portion of the external surface of the accessory button controller, the first and second portions aligned on symmetrically opposite sides of the printed circuit board, wherein:
   the first and second outer housing members enclose the printed circuit board and the plastic structure;
   the first and second outer housing members are configured to move toward one another in response to an applied force; and
   the movement of the first and second outer housing members toward one another causes an actuation of the at least one switch.

2. The accessory button controller of claim 1, wherein the first and second housing members partially enclose the strain relief structure.

3. The accessory button controller of claim 1, further comprising a metal clip interposed between one of the first or second housing members and the plastic structure.

4. The accessory button controller of claim 3, wherein the printed circuit board comprises at least one trace; and the metal clip comprises a portion that is shorted to the trace.

5. The accessory button controller of claim 4, wherein the first outer housing member and the second outer housing member are separated by a gap.

6. The accessory button controller of claim 1 further comprising:
   a microphone on the printed circuit;
   a conductive mesh covering the microphone; and
   conductive adhesive configured to attach the conductive mesh to the printed circuit over the microphone.

7. An accessory, comprising:
   an earbud comprising:
      a speaker driver enclosure portion; and
      a hollow neck portion;
   wires coupled to the earbud, the wires comprising a knot to retain the wires in the hollow neck portion;
   a bead threaded onto the wires to prevent compression of the knot; and
   an accessory button controller coupled to the wires, wherein the accessory button controller comprises:

a printed circuit comprising at least one switch mounted to the printed circuit;

a plastic structure that is overmolded over the printed circuit; and a housing assembly comprising first and second outer housing members positioned on opposite sides of the printed circuit board; and an overmolded strain relief structure that is coupled to the plastic structure at an end region and surrounds the wires, wherein:

at least one of the first or second outer housing members is configured to translate toward the printed circuit board;

the at least one switch is configured to generate an electrical response in response to the translation of the at least one of the first or second outer housing members; and the knot of the wires is tied to the bead.

8. The accessory of claim 7 wherein:

the wires comprise a plastic jacket; and a portion of the plastic structure is overmolded over the wires and bonds to the plastic jacket to retain the wires within the accessory button controller.

9. The accessory of claim 7, wherein the first outer housing member and the second outer housing member are separated by a gap.

10. The accessory of claim 9, further comprising:

at least one trace on the printed circuit;

a metal structure comprising:

an opening that engages a protrusion in the plastic structure;

at least one spring that shorts the metal structure to the trace; and a portion that receives electrostatic charge through the gap formed between the first outer housing member and the second outer housing member.

11. An accessory button controller, comprising:

a printed circuit having a least one conductive trace;

a switch on the printed circuit;

a housing having a first portion positioned along a top surface of the printed circuit board and a second portion positioned along a bottom surface of the printed circuit board, thereby enclosing the printed circuit within the housing;

a plastic structure that is overmolded over the printed circuit, the plastic structure includes at least one protrusion and defines an end region;

a strain relief structure coupled to, and overlapping the end region of, the plastic structure and extending beyond a perimeter of the housing; and a clip coupled to the housing, the clip comprising an opening that mates with the protrusion of the plastic structure; wherein:

the housing surrounds the plastic structure and a portion of the strain relief structure:

at least one of the first or second portions is configured to move toward the plastic structure and the portion of the strain relief structure in response to a user input; and the switch is configured to detect the user input using the movement of the first or second portions.

12. The accessory button controller of claim 11, wherein:

the accessory button controller further comprises a wiring that is coupled to the printed circuit;

the wiring comprises a plastic jacket;

the plastic structure is configured to bond with the plastic jacket to retain the wiring within the housing; and the strain relief structure surrounds the wiring.

13. The accessory button controller of claim 11, wherein the first portion of the housing is coupled to the clip; and the second portion of the housing is coupled to the plastic structure, the first and second portions are separated by a gap and the clip has a protrusion that is configured to receive electrostatic charge through the gap.

14. The accessory button controller of claim 13, wherein the clip comprises a spring portion that is shorted to the conductive trace on the printed circuit board to discharge electrostatic charge.

15. A method, comprising:

forming metal traces on a printed circuit board;

placing the printed circuit board in a molding tool having a set of injection molding shutoff structures with a recess that accommodates the metal traces by holding the printed circuit board while the recess overlaps the metal traces without crushing the metal traces;

injection molding a first plastic into a first cavity formed by the molding tool and one of the set of injection molding shutoff structures, the injection molded first plastic forming a plastic structure that covers the printed circuit board; and injection molding a second plastic into a second cavity formed by the molding tool and another of the set of injection molding shutoff structures, the injection molded second plastic forming a strain-relief structure surrounding a portion of the plastic structure at an end region, positioning a first outer housing member along a first surface of the printed circuit board, the injection molded plastic, and the portion of the strain relief structure;

positioning a second outer housing member along a second surface of the printed circuit board, the injection molded plastic, and the portion of the strain relief structure, opposite the first surface;

coupling the first and second outer housing members such that the first and second outer housing members are configured to move toward one another in response to an applied force, wherein the movement of the first and second outer housing members toward one another is configured to cause an actuation of at least one switch positioned on the printed circuit board.

16. The method of claim 15, wherein the printed circuit board comprises a button controller printed circuit board having metal traces covered with polymer film.

17. The accessory button controller in claim 4, wherein the metal clip comprises a portion that is configured to gather electrostatic charge that is discharged through the metal clip to the trace of the printed circuit board.

18. The accessory button controller in claim 5, wherein the metal clip comprises:

a protrusion that receives electrostatic charge through the gap; and a spring portion that is shorted to the trace.

19. The accessory of claim 10, wherein the metal structure discharges the electrostatic charge through the spring to the trace on the printed circuit.

20. The method of claim 16, wherein:

placing the printed circuit board in the molding tool comprises placing the button controller printed circuit board in the molding tool; and injection molding the plastic comprises injection molding the plastic without peeling off the polymer film.

* * * * *